(12) United States Patent
Stiff

(10) Patent No.: US 7,518,420 B1
(45) Date of Patent: Apr. 14, 2009

(54) DELAY CIRCUIT LIMIT DETECTION CIRCUIT AND METHOD

(75) Inventor: Jonathon C. Stiff, Moscow, ID (US)

(73) Assignee: Cypress Semiconductor Corporation, San Jose, CA (US)

(*) Notice: Subject to any disclaimer, the term of this patent is extended or adjusted under 35 U.S.C. 154(b) by 32 days.

(21) Appl. No.: 11/699,951

(22) Filed: Jan. 30, 2007

Related U.S. Application Data

(60) Provisional application No. 60/763,508, filed on Jan. 30, 2006.

(51) Int. Cl.
    *H03L 7/06* (2006.01)
(52) U.S. Cl. .............................. 327/156; 327/157
(58) Field of Classification Search ............ 327/156, 327/157
    See application file for complete search history.

(56) References Cited

U.S. PATENT DOCUMENTS

| | | | |
|---|---|---|---|
| 5,278,702 A | 1/1994 | Wilson et al. | |
| 5,572,167 A | 11/1996 | Alder et al. | |
| 5,694,087 A | 12/1997 | Ferraiolo et al. | |
| 5,864,572 A | 1/1999 | Bhagwan | |
| 6,111,442 A | 8/2000 | Aulet et al. | |
| 6,140,880 A * | 10/2000 | Moyal et al. | 331/1 A |
| 6,177,843 B1 | 1/2001 | Chou et al. | |
| 6,445,258 B1 | 9/2002 | Truong | |
| 6,782,068 B1 * | 8/2004 | Wilson et al. | 375/376 |
| 6,853,254 B2 * | 2/2005 | Li | 331/16 |
| 6,911,857 B1 | 6/2005 | Stiff | |

* cited by examiner

*Primary Examiner*—Kenneth B. Wells

(57) ABSTRACT

A delay limit detect circuit can determine the delay of a current steering delay cell, like those utilized in a voltage controlled oscillator (VCO), by monitoring a current ($I_{SENSE}$) that tracks a delay cell current (I2). When the monitored current ($I_{SENSE}$) outside of a limit, a signal LIMIT can be activated. A monitored current ($I_{SENSE}$) can be generated by a control replica circuit having the same circuit component types as a control circuit within a delay cell. Such limit detection can provide a way to prevent a ring VCO from entering a runaway state, particularly in cases where a maximum frequency can be reached before a maximum control voltage is reached.

20 Claims, 6 Drawing Sheets

DELAY CIRCUIT LIMIT DETECTION CIRCUIT AND METHOD

This application claims the benefit of U.S. provisional patent application Ser. No. 60/763,508, filed on Jan. 30, 2006, the contents of which are incorporated by reference herein.

TECHNICAL FIELD

The present invention relates generally to delay circuits, and more particularly to delay circuits that can be arranged into a ring to form a voltage control oscillator (VCO) for application in phase locked loops (PLLs), or other such circuits.

BACKGROUND OF THE INVENTION

Controllable delay circuits can enjoy wide application in timing circuits. One very particular application can be to arrange delay cells into a ring to form a ring oscillator. Such a ring oscillator can be used, as but one example, as a voltage controlled oscillator (VCO) in a phase locked loop (PLL) circuit, or the like.

To better understand various aspects of the embodiments, a number of conventional circuits will now be described.

FIG. 8 shows a ring oscillator 800 formed by a number of delay cells 802-0 to 802-n arranged into a ring to generate an oscillating signal OSC. Each delay cell (802-0 to 802-n) can be essentially identical. A delay introduced by each delay cell (802-0 to 802-n) can be controlled according to a control voltage Vctrl. As but one example, as Vctrl increases, the oscillating frequency for circuit 800 can increase. A ring oscillator 800 used for voltage controlled oscillation can be employed in a phase locked loop (PLL). A PLL includes a control loop circuit that manipulates a VCO control voltage (Vctrl) in order to match an output signal phase to an input reference signal phase.

One type of conventional PLL is shown in FIG. 9 and designated by the general reference character 900. A conventional PLL 900 can include a phase and/or frequency (PFD) detector 902 that can determine the phase and/or frequency difference between an input signal φIN and an output signal φOUT. Each such signal can be frequency divided before such a comparison. In the example of FIG. 9, input signal φIN can be frequency divided by a divider 904, while output signal φOUT can be frequency divided by a divider 906. PFD 902 can output a phase (or frequency) difference value Δφ to a charge pump 908, which can charge a node 910 in response, to thereby generate a control voltage Vctrl. Such a control voltage (Vctrl) can be filtered by a loop filter 912. According to control voltage (Vctrl), a VCO 914 can generate output signal φOUT. Feedback path 916 can provide output signal φOUT back to PFD 902.

Referring still to FIG. 9, due to any number of circuit failures in the PLL feedback path 916, a PLL 900 can sometimes inadvertently fall into an unrecoverable state where the PLL 900 can no longer achieve phase lock. One such state can be a "runaway" condition, in which the PLL feedback path fails above a particular operating frequency, removing the PLL feedback from the PFD 902. Such a missing feedback signal will be detected as having a phase (and/or frequency) below that of the input signal φOUT, causing PFD 902 to show a positive phase difference. This can result in an increase in control voltage (Vctrl) and with it, an increase in PLL output phase and frequency.

Thus, because a PLL feedback path 916 is inoperative above a certain frequency, and the failure causes the PLL output frequency to increase, a PLL 900 can ultimately drive a control voltage (Vctrl) to a maximum (and with it the VCO maximum frequency) with the PLL 902 having no ability to correct the state and return to normal operation.

In order to correct a runaway condition, conventional approaches have attempted to detect when a maximum VCO frequency is reached according to an applied control voltage (Vctrl). Two conventional maximum frequency-detect circuits are shown in FIGS. 10 and 11. FIG. 10 shows a conventional arrangement in which a control voltage (Vctrl), utilized to establish the VCO frequency, can be compared with a reference voltage (Vref) by a comparator having hysteresis. In this way, a limit signal LIMIT can be activated when control voltage Vctrl exceeds a voltage Vref (or a Vref plus some predetermined amount). Conversely, an active limit signal LIMIT can be de-activated when control voltage Vctrl falls below voltage Vref (or is less than Vref by a predetermined amount). FIG. 11 shows a conventional arrangement utilizing a simple CMOS inverter to activate/de-activate a LIMIT signal based on a control voltage level. Thus, a limit is established according to the inverter threshold voltage.

In both conventional arrangements of FIGS. 10 and 11, a LIMIT signal can be utilized to signal a circuit or state machine to correct the runaway condition by forcing the reduction of a control voltage (Vctrl) such that a VCO frequency returns to below the runaway condition frequency threshold.

To better understand aspects of the embodiments, a conventional delay cell will be described. A conventional delay cell is shown in FIG. 12, and designated by the general reference character 1200. FIG. 12 shows one example of a current steering type delay cell that includes a first current source 1202, a second current source 1204, a differential pair of transistors 1206, a cross-coupled pair of transistors 1208, a first load 1210, and a second load 1212. A delay introduced by a delay cell 1200 can vary according to a current $I_1$ provided to differential pair 1206 and a current $I_2$ provided to cross coupled pair 1208. In addition, conventional delay cell 1200 can include control section 1214.

A control section 1214 can control current values I1 and I2 according to a control voltage (Vctrl) and reference voltage (Vref), and thus control a delay of delay cell 1200. In particular, a control section 1214 can draw a control current ($I_{CTRL}$) according to a control voltage (Vctrl) and a reference current ($I_{REF}$) according to a reference voltage (Vref). As a control voltage (Vctrl) increases, a control current ($I_{CTRL}$) can be shunted through transistor M121 and R121, thus decreasing the magnitude of current I2, and thus decreasing a delay of delay cell 1200. Conversely, as a control voltage (Vctrl) decreases, less control current ($I_{CTRL}$) can be shunted through transistor M121 and R121, thus increasing a magnitude of current I2. This can increase a delay of delay cell 1200.

Further, due to current source I120, as a control current ($I_{CTRL}$) increases, a reference current ($I_{REF}$) can decrease. Looked at in another way, current I2 is the difference between current I (1204) and $I_{REF}$ Likewise, current I1 is the difference between current 2I (1202) and $I_{CTRL}$. In this way, the sum of currents I1 and I2 is constant.

Another conventional delay cell is described in detail in U.S. Pat. No. 6,911,857 B1, issued to Jonathon C. Stiff, on Jun. 28, 2005, titled CURRENT CONTROLLED DELAY CIRCUIT.

A drawback to conventional approaches to detecting a maximum VCO frequency, like those described above in FIGS. 10 and 11, is that such approaches can be too inaccurate for some delay cells and/or some applications. In particular, for some delay cells, a control voltage may not be representative of a full range of delay. Even more particularly, in a delay cell like that shown in FIG. 12, a steered current ($I_2$) may reach a maximum value before a control voltage (Vctrl) reaches a maximum value. Thus, a maximum frequency (and hence the possibility of runaway) can be reached prior to a maximum control voltage level.

One representation of such an arrangement is shown in FIG. 13. FIG. 13 is a graph showing a steered current (12) (or a reference current ($I_{REF}$)) versus an applied control voltage (Vctrl). A current level $I_{RUN}$ can correspond to a steered (or reference) current value at which VCO runaway can take place. A control voltage value $V_{MAX}$ can be a maximum control voltage level. As shown, a runaway condition can be reached prior to a maximum control voltage level.

It is understood that the graph of FIG. 13 is provided for illustrative purposes. An actual circuit response can vary (i.e., be non-linear).

In other cases, variations in manufacturing process, operating temperature and/or operating voltage may cause variations in delay cell response that are not adequately reflected by a comparator circuit and/or inverter, like those of FIGS. 10 and 11.

DETAILED DESCRIPTION

Various embodiments of the present invention will now be described in detail with reference to a number of drawings. The embodiments show very particular examples of delay limit detect circuits and corresponding methods, that can be used to prevent runaway and other conditions in a voltage controlled oscillator type circuit.

Figure 1:
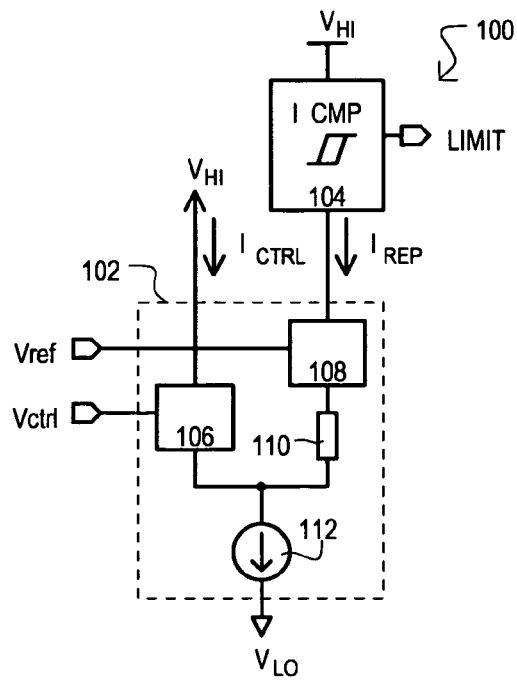
FIG. 1 is a block diagram of a delay limit detect circuit according to a first embodiment of the present invention.

FIG. 1 shows a delay limit detect circuit 100 according to a first embodiment of the present invention. A circuit 100 can include a control section replicator 102 and a current compare circuit 104. A control section replicator 102 can replicate a switching control arrangement present in a current switching delay cell of a voltage controlled oscillator (VCO). In particular, just as a current switching delay cell can draw a steered current representative of a delay for a delay cell, a circuit 100 can draw a replication current IREP corresponding to such a steered current.

In the particular example of FIG. 1, a control section replicator 102 can include a first controllable impedance path 106, a second controllable impedance path 108, an impedance 110, and a current source 112. A first path 106 can be connected between a high power supply VHI and current source 112, and can be controlled according to a control voltage (vctrl). A second path 108 can be connected in series with an impedance 110 between current compare circuit 104 and current source 112. Second current path 108 can be controlled according to a reference voltage (IVref). A reference voltage (Vref) can be an essentially constant voltage during normal operations of circuit 100. A control voltage (Vctrl) can be a voltage that can vary during normal operations of circuit 100, corresponding to increases and decreases in a delay of a delay cell.

Second path 108 can draw a replicator current (IREP). More particularly, as a control voltage (Vctrl) increases, a replicator current (IREP) can decrease. Conversely, as a control voltage (Vctrl) decreases, a replicator current (IREP) can increase.

A current compare circuit 104 can compare a replicator current (IREP) against one or more limits, and in response thereto, activate a limit signal LIMIT. In one very particular example, current compare circuit 104 can compare replicator current (IREP) to some minimum value ($I_{LIMIT}$), and if the replicator current (IREP) falls below such a minimum value, activate a limit signal LIMIT. Preferably, a current compare circuit 104 includes some hysteresis with respect to a detection level. As but one example, if current compare circuit 104 activates signal LIMIT when a replicator current (IREP) is less than current $I_{LIMIT}$, current compare circuit 104 will de-activate signal LIMIT once a replicator current (IREP) is greater than current $I_{LIMIT}$ by more than some predetermined amount.

Circuit 100 is preferably formed from like circuit components as those of a replicated VCO. In one very particular example, a control section replicator 102 can replicate a control section like that shown as 1214 in FIG. 12.

Figure 2:
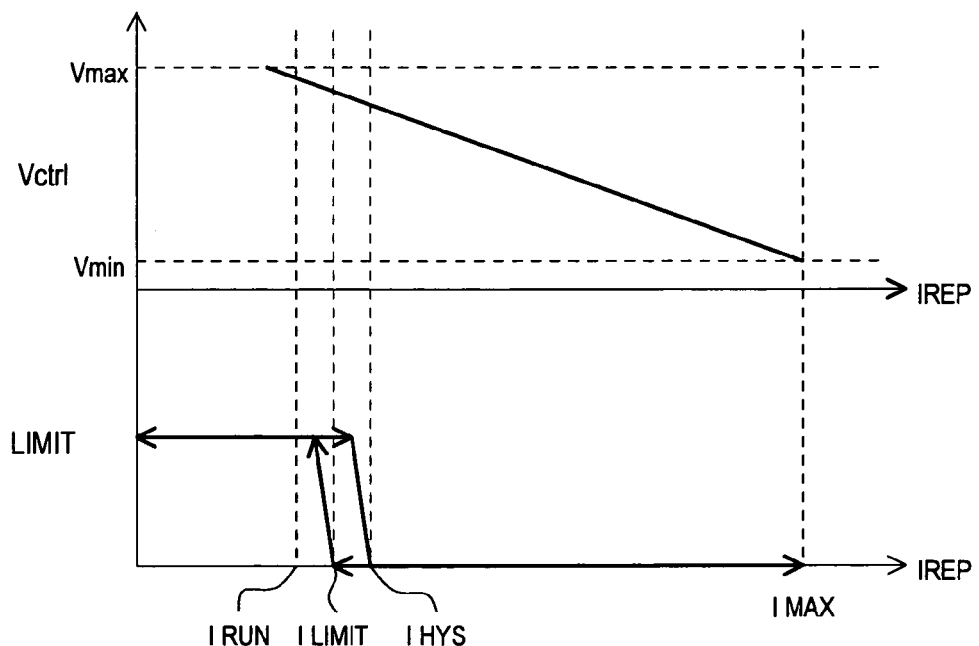
FIG. 2 is a graph illustrating the general operation of the circuit shown in FIG. 1.

One example of the operation of circuit 100 is shown in FIG. 2. FIG. 2 is a graph showing a relationship between an applied control voltage (Vctrl) and a signal LIMIT with respect to a replicated current ($I_{REP}$). A control voltage (Vctrl) has a maximum value Vmax and well as a minimum value Vmin. A replicated current ($I_{REP}$) shows three levels: $I_{RUN}$, which corresponds to a level at which a runaway condition can occur in a replicated VCO; $I_{LIMIT}$, which corresponds to a current level at which a LIMIT signal can be activated (go high, in this example); and $I_{HYS}$, which corresponds to a current level at which a LIMIT signal can return from an active level to an inactive level (return low, in this example). In the graph for signal LIMIT, such a hysteresis effect is indicated by arrows.

It is understood that the graph of FIG. 2 is provided for illustrative purposes. An actual circuit response can vary (i.e., be non-linear).

Figure 3:
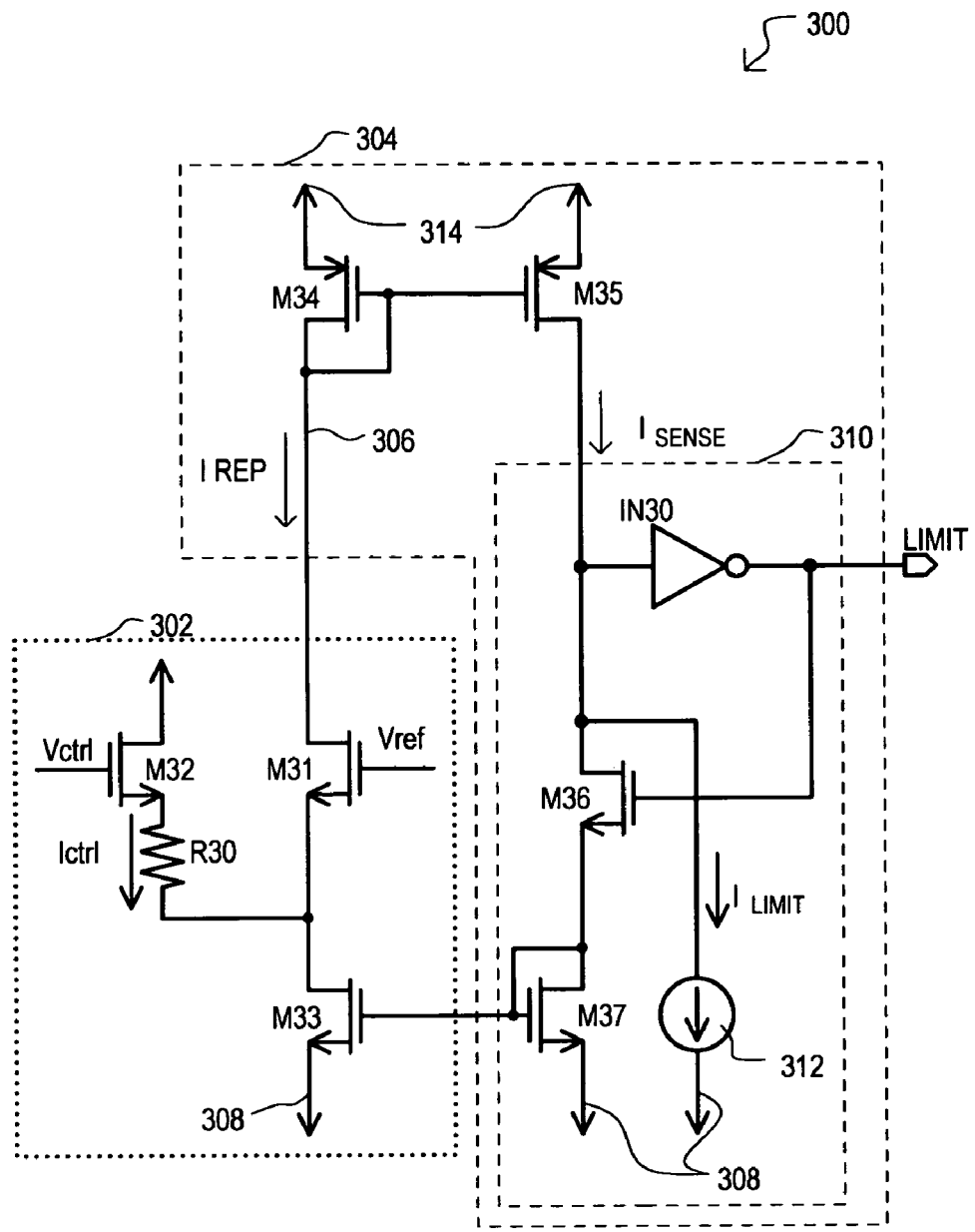
FIG. 3 is a block diagram of a delay limit detect circuit according to a second embodiment of the present invention.

FIG. 3 shows a delay limit detect circuit 300 according to a second embodiment of the present invention. A circuit 300 can include some of the same general sections as FIG. 1, including a control section replicator 302 and a current compare circuit 304.

In the very particular example of FIG. 3, a control section replicator 302 can include a first switching transistor M31, a second switching transistor M32, a resistor R30, and a current source transistor M33. A switch transistor M32 can have a source-drain path connected in series with resistor R30 between a high power supply voltage and a drain of current reference transistor M33. Switch transistor M31 can have a source-drain path connected between a replicated current node 306 and a drain of current reference transistor M33. Switch transistor M31 can receive a reference voltage (Vref) at its gate. Switch transistor M32 can receive a control voltage (Vctrl) at its gate. A current source transistor M33 can have a source connected to a low power supply voltage node. The example of FIG. 3, transistors M31 and M32 are n-channel transistors.

Figure 12:
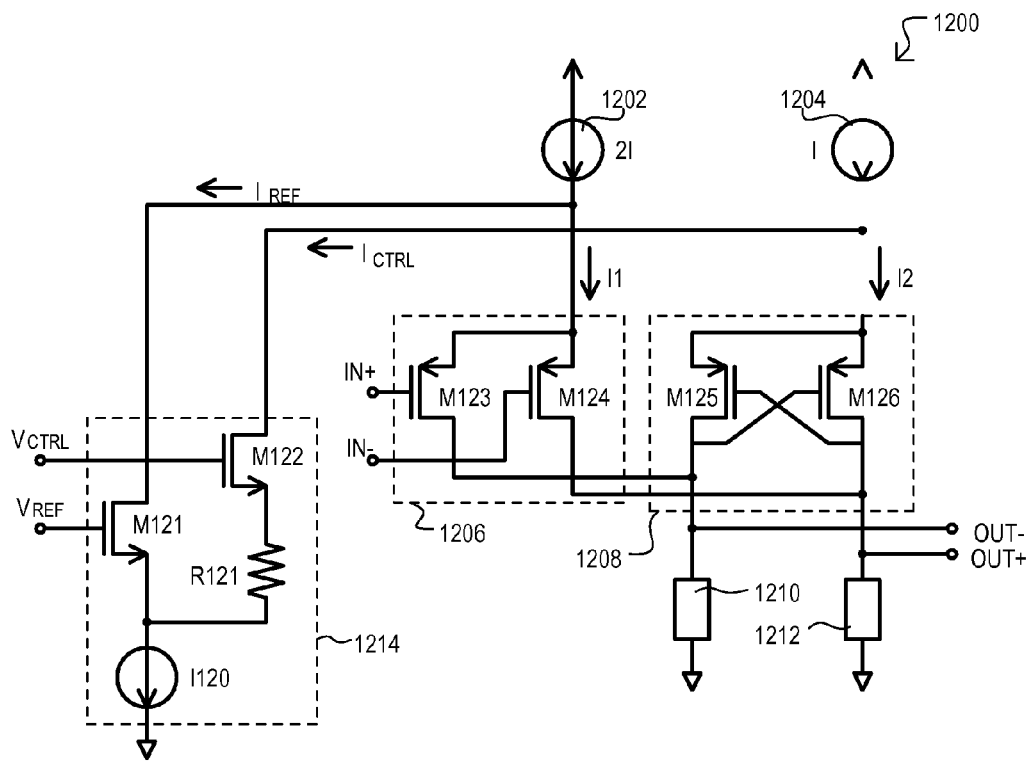
FIG. 12 is a schematic diagram of a conventional current steering delay cell.

In one particular arrangement, a control section replicator 302 can be a replica of a control section 1214 in a delay cell 1200 like that of FIG. 12. More particularly, transistors M31 and M32 can be formed with the same manufacturing steps as transistors M121 and M122. Even more particularly, transistors M31 and M32 can be essentially identical to transistors M121 and M122, respectively. Along these same lines, a reference voltage (Vref) received at a gate by transistor M31 can be the same as that received by transistor M121 and a control voltage (Vctrl) received at a gate by transistor M32 can be the same as that received by transistor M122.

In operation, control section replicator 302 can replicate current switching control operations of delay cells in a VCO or similar circuit, by drawing a replicated current IREP that varies according to a control voltage (Vctrl) and/or a reference voltage (Vref).

Referring still to FIG. 3, a current compare circuit 304 can include a current mirror formed by transistors M34 and M35, and a latching circuit 310. A current mirror M34/M35, can mirror a replicated current IREF drawn by a control section replicator 302 to provide a sense current $I_{SENSE}$. A sense current $I_{SENSE}$ can be detected to determine if a replicated current IREF has fallen below a predetermined limit, which in particular embodiments, can indicate that a generated frequency is approaching a "runaway" limit. In the very particular example of FIG. 3, a current mirror can be formed from p-channel transistors, and thus can include mirror transistor M34 having a source connected to a high power supply node 314, a gate and drain connected to the gate of p-channel transistor M35. P-channel transistor M35 can also have a source connected to a high power supply voltage node 314.

A latching circuit 310 can include an inverter IN30, a latching transistor M36, a limit current source 312, and a load transistor M37. Inverter IN30 can have an input connected to a drain of transistor M35 and an output that generates signal LIMIT. Latching transistor M36 can have a drain connected to the input of inverter IN30, a gate connected to the output of inverter IN30, and a source connected to a drain of load transistor M37. Load transistor M37 can have a gate connected to its drain and to the gate of transistor M33 within control section replicator 302, and a source connected to a low power supply node 308.

Limit current source 312 can be connected between an input of inverter IN30 and a low power supply node 308.

In operation, assuming a control voltage (Vctrl) is well below a maximum value (or value corresponding to a runaway limit), inverter IN30 can have an input that is high, as replicated current IREF (and correspondingly sense current $I_{SENSE}$) can be greater than a limit current ILIMIT drawn by limit current source 312. As a result, feedback transistor M36 can be turned off (have a high impedance) and signal LIMIT can be inactive (low, in this example).

As a control voltage Vctrl increases, a replicated current IREP can decrease, resulting in sensed current $I_{SENSE}$ decreasing. Conversely, as control voltage Vctrl decreases, a replicated current IREP and sensed current $I_{SENSE}$ can increase.

In such an arrangement, as a control voltage Vctrl continues to increase, sensed current $I_{SENSE}$ can decrease until limit current source 312 can sink more current than sensed current $I_{SENSE}$. This will pull the input of inverter IN30 low, turning on transistor M36 and driving signal LIMIT to an active level (high).

Hysteresis can be provided by activation of latching transistor M36. Once transistor M36 is on, a sensed current $I_{SENSE}$ must source more current than that sunk by both current source 318 and the current path formed by transistor M36 and M37 before the input of inverter IN30 may be returned to a high level.

While a current comparison can be accomplished utilizing a replication circuit situated separately from a corresponding VCO circuit (or other monitored current switching delay cell), other embodiments can be incorporated into a current switching structure of such cells. One particular embodiment showing such an arrangement is represented in FIGS. 4 and 5.

Figure 4:
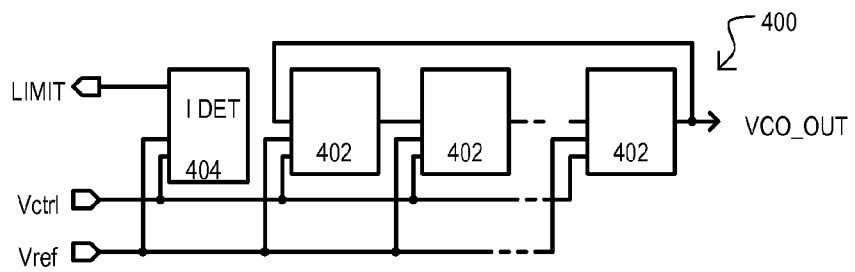
FIG. 4 is a schematic diagram of a voltage controlled oscillator incorporating a delay limit detect circuit according to an embodiment of the present invention.

FIG. 4 shows a VCO incorporating current limit detection according to an embodiment. A VCO 400 can include a number of delay cells 402 arranged into a ring. Delay cells 402 may each have the same structure as FIG. 12. In addition, a VCO 400 can include detect circuit 404 that can activate a limit signal when a current switched within each delay cell is determined to approach a runway condition. A detect circuit 404 can be formed in close proximity to delay cells 402, and from the same processing steps in order to provide close matching of circuit devices.

Figure 5:
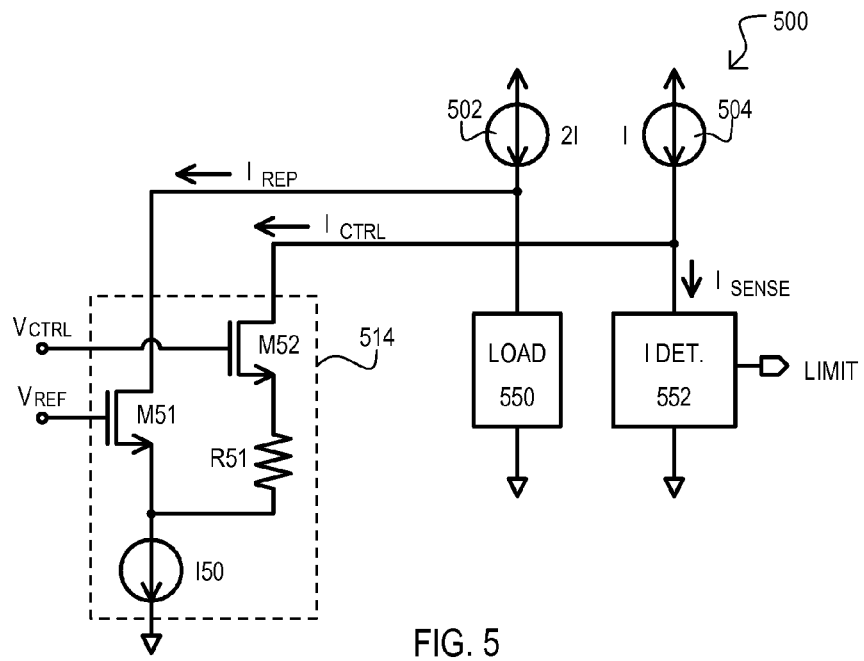
FIG. 5 is a block schematic diagram of a detect circuit that can be utilized in a circuit like that shown in FIG. 4.
Figure 13:
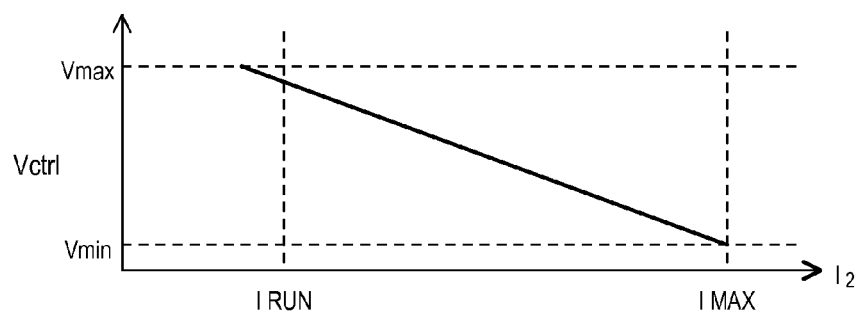
FIG. 13 is a graph showing a general response for the conventional control voltage steering delay cell of FIG. 12.

FIG. 5 shows one example of a detect circuit like that shown as 404 in FIG. 4. A detect circuit 500 can include identical components to those utilized in a current switching delay cell, like that of FIG. 12. Accordingly, like sections are referred to by the same reference character, but with the first digit being a "5" instead of "13". However, unlike the circuit of FIG. 13, detect circuit 505 can include load 550 and current compare circuit 552.

A current compare circuit 552 can monitor a sense current $I_{SENSE}$, and activate a limit signal when such a current falls below a predetermined value. In one very particular embodiment, a current sense circuit can have the same general structure as that shown as 310 in FIG. 3.

Figure 6:
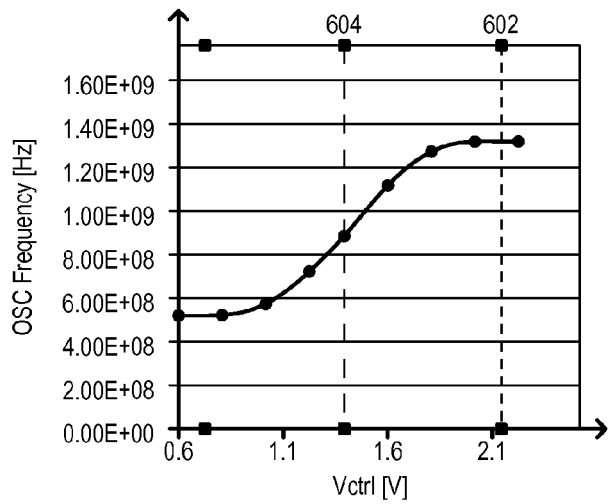
FIG. 6 is a graph showing the response of one particular embodiment.

FIG. 6 shows a graph comparing detection results according to one particular embodiment. FIG. 6 shows results achievable with a circuit like that shown in FIG. 3 utilized in conjunction with a ring oscillator formed with delay stages like those shown in FIG. 12. In FIG. 6, a level 602 shows a control voltage that can activate a limit signal, indicating a frequency is too high. A level 604 shows a control voltage that can result in a limit signal returning to an inactive level after being activated. It is noted that conventional signal activation ranges could vary to beyond a runaway limit, according to operating conditions and/or process variations.

Figure 7:
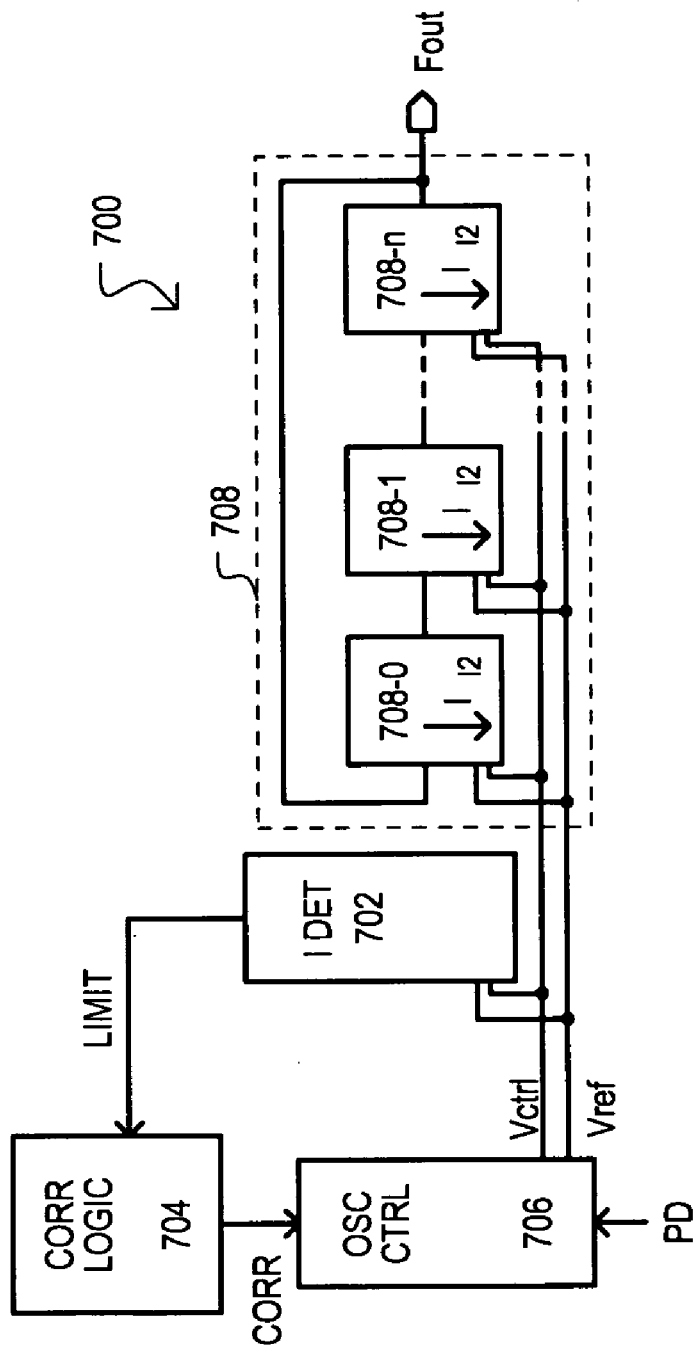
FIG. 7 is a block schematic diagram showing a delay limit detect circuit according to a fifth embodiment of the present invention.
Figure 8:
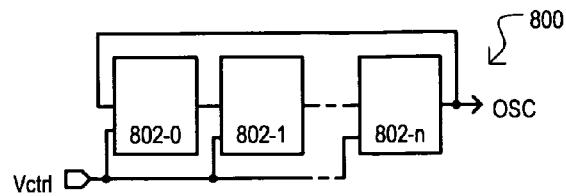
FIG. 8 is a block schematic diagram of a ring type voltage controlled oscillator.
Figure 9:
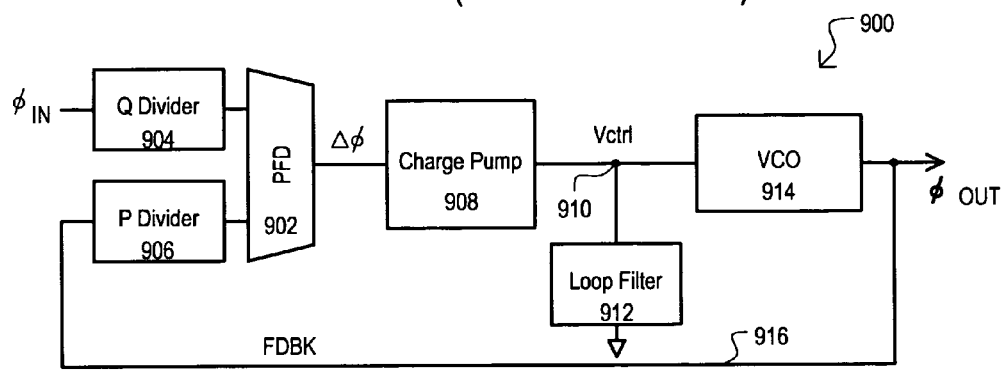
FIG. 9 is a block schematic diagram of a conventional phase locked loop (PLL).
Figure 10:
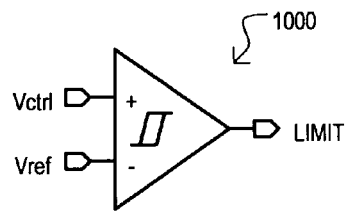
FIG. 10 is a schematic diagram of a conventional maximum frequency detect circuit.
Figure 11:
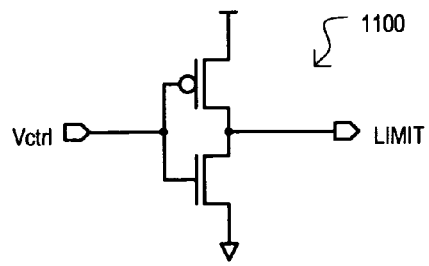
FIG. 11 is a schematic diagram of another conventional maximum frequency detect circuit.

FIG. 7 is a block schematic diagram showing a delay limit detect circuit 700 according to another embodiment of the present invention. A circuit 700 can include a current detect circuit 702, correction logic 704, oscillator control circuit 706, and ring oscillator 708. A current compare circuit 702 can monitor a switched current value to activate a signal LIMIT according to any of the above embodiments. Correction logic 704 can generate correction signals CORR in response to an active LIMIT signal.

Oscillator control circuit 706 can generate signals for controlling ring oscillator 708. In addition, oscillator control circuit 706 can respond to active correction signals CORR. In the very particular example of FIG. 7, oscillator control circuit 706 can generate control values (e.g., control voltage (Vctrl) and reference voltage (Vref)) for each delay stage (708-0 to 708-n) of ring oscillator 708, as well as current detect circuit 702. Further, oscillator control circuit 706 can vary a control value (e.g., Vctrl) according to an input value PD. Thus, provided signals CORR are not active, oscillator control circuit 706 can operate in a conventional fashion. In response to value PD, current switching within each delay stage (708-0 to 708-n) can be controlled to thereby establish an oscillating frequency for ring oscillator 708.

However, if signals CORR are active, oscillator control circuit 706 can operate to avoid a runaway condition. In one very particular example, in response to active CORR signals, oscillator control circuit 706 can force a control values (e.g., Vctrl) to a level that forces a frequency to drop well below that of a maximum frequency (e.g., frequency approaching a runaway limit). As a result, an oscillation speed can be forced to slow down, and thus avoid a runaway condition. Of course, this is but one way to alter oscillator behavior in response to a LIMIT signal.

It is understood that while the embodiments are illustrated with CMOS technology this should not necessarily be construed as limiting the invention thereto. Other transistor types, including bipolar transistors can provide controllable impedance paths and/or switching operations.

Similarly, while the above embodiments have detected a current that decreases as an oscillating frequency increases, other embodiments can detect currents that vary in the opposite fashion. As but one example, in the particular example of FIG. 1, a current $I_{CTRL}$ drawn in response to a control signal (Vctrl) can be monitored. If such a current exceeds some value, a LIMIT signal can be activated to prevent a runaway condition (assuming a PLL application).

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A circuit for detecting a delay cell limit, comprising:
    at least one delay cell circuit that receives at least one input signal and outputs at least one output signal and includes at least one current path that draws a delay current according to an applied control voltage, the delay current magnitude establishing a delay between the input signal and output signal; and
    a current replicator circuit, formed in a same integrated circuit substrate of the at least one delay cell circuit, that activates a limit indication when the delay current is determined to have reached a predetermined limit.

2. The circuit of claim 1, wherein:
the current replicator circuit includes a first controllable impedance path having an impedance controlled according to the control voltage.

3. The circuit of claim 2, wherein:
the current replicator further includes a second controllable impedance path having an impedance controlled according to a reference voltage; and
the first and second controllable impedance path are commonly coupled to a current source.

4. The circuit of claim 3, wherein:
the first and second controllable impedance paths comprise n-channel insulated gate field effect transistors.

5. The circuit of claim 1, wherein:
the current replicator circuit includes
    at least one controllable impedance path that draws replicated current in response to the control voltage, the replicated current varying according to changes in the delay current, and
    at least one limit current source that sources a limit current, wherein
    the limit indication is activated according to a comparison between the replicated current and the limit current.

6. The circuit of claim 5, wherein:
the current replicator circuit includes a latch circuit that activates the limit indication when the replicated current is less than the limit current.

7. The circuit of claim 6, wherein:
the latch circuit includes hysteresis and de-activates the limit indication when the replicated current is greater than the limit current by a hysteresis current difference.

8. The circuit of claim 1, wherein:
the at least one delay cell circuit is repeated a plurality of times, with the input of each current steering delay cell circuit being coupled to the output of another delay cell circuit to form a ring oscillator; and
the limit indication indicates a maximum allowable frequency for the ring oscillator.

9. The circuit of claim 1, wherein:
the at least one delay cell circuit comprises
    a first essentially constant current source,
    a second essentially constant current source,
    a current switching circuit that selectively switches current provided from the first and second essentially constant current sources to at least two different loads, and
    a control section that selectively shunts current provided from the second essentially constant current source away from the current switching circuit; and
    the current replicator circuit includes a control section replicator having the same circuit structure as the control section.

10. The circuit of claim 9, wherein:
the control section comprises a first switch transistor that provides a controllable impedance path that shunts current provided from the second essentially constant current source in response to the control voltage.

11. The circuit of claim 9, wherein:
the current replicator circuit comprises
    a first essentially constant replicator current source,
    a second essentially constant replicator current source,
    a replicator current switching circuit that selectively switches current provided from at least the second essentially constant replicator current source, and
    a current compare circuit that activates the limit indication according to the current shunted from the second essentially replicator constant current source.

12. A circuit for detecting a current limit of a delay cell, comprising:
    a ring oscillator comprising a plurality of delay stages coupled to one another in series, the delay of each delay stage corresponding to at least one delay current drawn within the delay stage; and a current compare circuit that activates a frequency limit indication based on a current measurement corresponding to the delay current of at least one delay stage with respect to a constant reference current.

13. The circuit of claim 12, wherein:
the current compare circuit comprises
a replica circuit that generates a replica current that varies according to variations in the delay current, and
a compare circuit that compares the replica current to the reference current to generate the frequency limit indication.

14. The circuit of claim 13, wherein:
the compare circuit comprises
a current mirror having a first leg and second leg,
a compare replica circuit coupled to the first leg that generates an impedance that varies according to variations in the delay current, and
a detect circuit coupled to the second leg that activates the frequency limit indication when a current drawn by the second leg is outside a predetermined limit.

15. The circuit of claim 13, wherein:
the replica circuit comprises
a first transistor having a controllable current path coupled between a first power supply node and a control current source,
a second transistor having a controllable current path coupled between the current compare circuit and the control current source, and
the current compare circuit comprises a sense node having a potential that varies according to a difference between a current drawn by the second transistor and a limit current drawn by a limit current source.

16. A method of delay cell control, comprising the steps of:
selectively switching at least two essentially constant currents to a load circuit to control the delay of a delay cell;
monitoring a load current corresponding to a current provided to the load circuit; and
activating a frequency limit signal in response to the load current being outside a predetermined limit as determined by comparing the load current to a constant reference current.

17. The method of claim 16, wherein:
activating the frequency limit signal includes activating a maximum frequency signal when the monitored current is determined to be greater than the predetermined limit.

18. The method of claim 16, wherein:
monitoring the current provided to the load circuit includes generating a replica current that varies according to variations in the monitored current; and
activating the frequency limit signal includes activating the frequency limit signal in response to a comparison between the replica current and a limit reference current.

19. The method of claim 16, further including:
selectively switching at least two essentially constant currents to the load circuit includes selectively switching essentially constant current supply circuits in a plurality of delay cells arranged into a ring to generate an oscillating signal.

20. The method of claim 19, further including:
providing a control voltage to each delay cell to control the oscillating signal frequency; and
forcing the control voltage to a predetermined level in response to the activation of the frequency limit signal.

* * * * *